(12) United States Patent
Lu et al.

(10) Patent No.: US 10,352,986 B2
(45) Date of Patent: Jul. 16, 2019

(54) METHOD AND APPARATUS FOR CONTROLLING VOLTAGE OF DOPED WELL IN SUBSTRATE

(71) Applicant: United Microelectronics Corp., Hsinchu (TW)

(72) Inventors: Hsin-Pang Lu, Hsinchu County (TW); Hsin-Wen Chen, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 62 days.

(21) Appl. No.: 15/164,129

(22) Filed: May 25, 2016

(65) Prior Publication Data

US 2017/0345720 A1 Nov. 30, 2017

(51) Int. Cl.
| | |
|---|---|
| *G05F 1/56* | (2006.01) |
| *G01R 31/26* | (2014.01) |
| *H01L 49/02* | (2006.01) |
| *H01L 27/092* | (2006.01) |
| *H01L 21/8238* | (2006.01) |

(52) U.S. Cl.
CPC .............. *G01R 31/26* (2013.01); *G05F 1/56* (2013.01); *H01L 28/40* (2013.01); *H01L 21/823892* (2013.01); *H01L 27/092* (2013.01)

(58) Field of Classification Search
CPC ........... G01R 31/00; G01R 31/26; G05F 1/00; G05F 1/56; H01L 21/00; H01L 21/823493; H01L 22/00; H01L 22/26; H01L 28/00; H01L 28/40; H03K 17/00; H03K 17/04123; H03K 17/04126; H03K 17/04213; H03K 17/063; H03K 17/567
USPC ........................................................ 327/374
See application file for complete search history.

(56) References Cited

U.S. PATENT DOCUMENTS

| | | | |
|---|---|---|---|
| 4,904,885 A | 2/1990 | Yamada et al. | |
| 5,172,013 A | 12/1992 | Matsumura | |
| 7,126,370 B2 | 10/2006 | Bhattacharya | |
| 7,504,877 B1 * | 3/2009 | Voogel | H02M 3/07 327/534 |
| 7,714,637 B2 | 5/2010 | Kuriyama | |
| 7,956,669 B2 | 6/2011 | Chuang et al. | |

* cited by examiner

*Primary Examiner* — Lincoln D Donovan
*Assistant Examiner* — Dave Mattison
(74) *Attorney, Agent, or Firm* — J.C. Patents

(57) ABSTRACT

A method for controlling voltage of a doped well in a substrate is provided. The substrate and the doped well are in different conductive type. The method includes applying a substrate voltage to the substrate while a well power for applying a well voltage to the doped well is turned off. The method also includes detecting a voltage level of one of the doped well and the substrate to judge whether or not a voltage target is reached. The well power is turned on to apply the well voltage to the doped well when the voltage level as detected reaches to the voltage target.

20 Claims, 7 Drawing Sheets

METHOD AND APPARATUS FOR CONTROLLING VOLTAGE OF DOPED WELL IN SUBSTRATE

BACKGROUND OF THE INVENTION

1. Field of the Invention

The present invention generally relates to semiconductor fabrication technology, in particular, to a method and an apparatus for controlling voltage of a doped well in a substrate.

2. Description of Related Art

An integrated circuit usually includes a large number of field effect transistors (FETs) formed on a substrate, in which the field effect transistors may include P-type metal-oxide-semiconductor (MOS) transistor or N-type MOS transistor on the substrate in doped wells with proper conductive type.

In operation to the FETs, particularly to system such as a liquid crystal display (LCD) panel in an example, the polarity of the pixels may be driven in dot inversion as an example. In this situation, the voltage of the P-type substrate would be switched between 0V (ground voltage) and a negative voltage as example. However, in the conventional way, the N-well and the deep N-well is kept at a constant positive voltage while the P-type substrate is switched to a negative voltage.

There is at least an issue in above conventional manner to control the voltage of N-well. When the voltage at the substrate is switched, it would take a long time to charge or discharge the substrate. Since the substrate is switched frequently, a long voltage switching time for the substrate would affect the operation speed.

How to reduce the voltage switching time on the substrate in operation is an issue in an example to be considered in technology development.

SUMMARY OF THE INVENTION

Accordingly, the invention is directed to a method for controlling voltage of a doped well in a substrate, or a method for controlling voltages on a first-type doped region and a second-type doped region in a substrate.

In an embodiment of the invention, a method for controlling voltage of a doped well in a substrate is provided. The substrate and the doped well are in different conductive type. The method includes applying a substrate voltage to the substrate while a well power for applying a well voltage to the doped well is turned off. The method also includes detecting a voltage level of one of the doped well and the substrate to judge whether or not a voltage target is reached. The well power is turned on to apply the well voltage to the doped well when the voltage level as detected reaches to the voltage target.

In an embodiment of the invention, an apparatus for controlling voltage of a doped well in a substrate is provided, wherein the substrate and the doped well are in different conductive type. The apparatus includes a substrate power with capability to provide a substrate voltage. Further, a well power has capability to provide a well voltage. When the substrate power starts to apply the substrate voltage to the substrate, the well power stops applying the well voltage to the doped well. A detector is to detect a voltage level of one of the doped well and the substrate to judge whether or not a voltage target is reached. When the voltage target is reached, the well power under control starts to apply the well voltage to the doped well.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
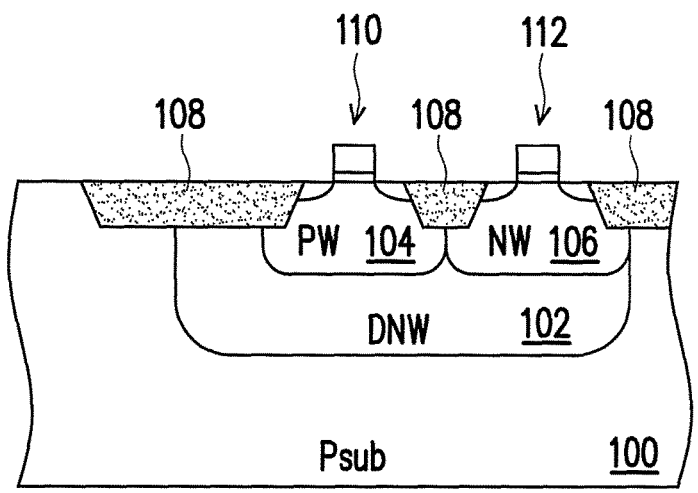
FIG. 1 is a drawing, schematically illustrating a cross-sectional view of a semiconductor device, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In accordance with the operation of MOS transistor in the driver circuit of display, the P-substrate often needs to be switched from 0V to a negative voltage while the N-well has an intended voltage offset higher than the P-substrate. Likewise, the P-substrate often needs to be switched from the negative voltage to 0V. In this situation, it takes long time to discharge or charge.

The invention proposes the method to control the voltages on the P-substrate and the N-well to efficiently reach to the intended voltage levels. The mechanism is using a parasitic capacitor between the P-substrate and the N-well. In the process, when the P-substrate is switched to the intended voltage level at the beginning stage, the N-well, as another terminal of the parasitic capacitor, is set to be floating state, so the voltage level of the N-well is also changing in accordance with the change of the P-substrate due to the coupling of the parasitic capacitor. At the second stage, when the voltage level of a detected one from the N-well or the P-substrate reaches to the target (threshold), the N-well is applied with the intended voltage level, which has a voltage offset from the P-substrate.

Several embodiments are provided to describe the invention but not for limiting the invention.

FIG. 1 is a drawing, schematically illustrating a cross-sectional view of a semiconductor device, according to an embodiment of the invention. In FIG. 1, the invention takes a semiconductor device as an example for consideration about switching the substrate voltage between two voltage levels, such as a ground voltage and a negative voltage. The semiconductor devices, such as the MOS transistors 110, 112, are formed on a substrate 100. The substrate 100 usually is a P-type substrate (Psub). In order to adapt the P/N MOS transistors 110, 112, the substrate 100 has been accordingly doped to form a deep N-type well (DNW) 102, an N-type well (NW) 106 and a P-type well (PW) 104.

Figure 2:
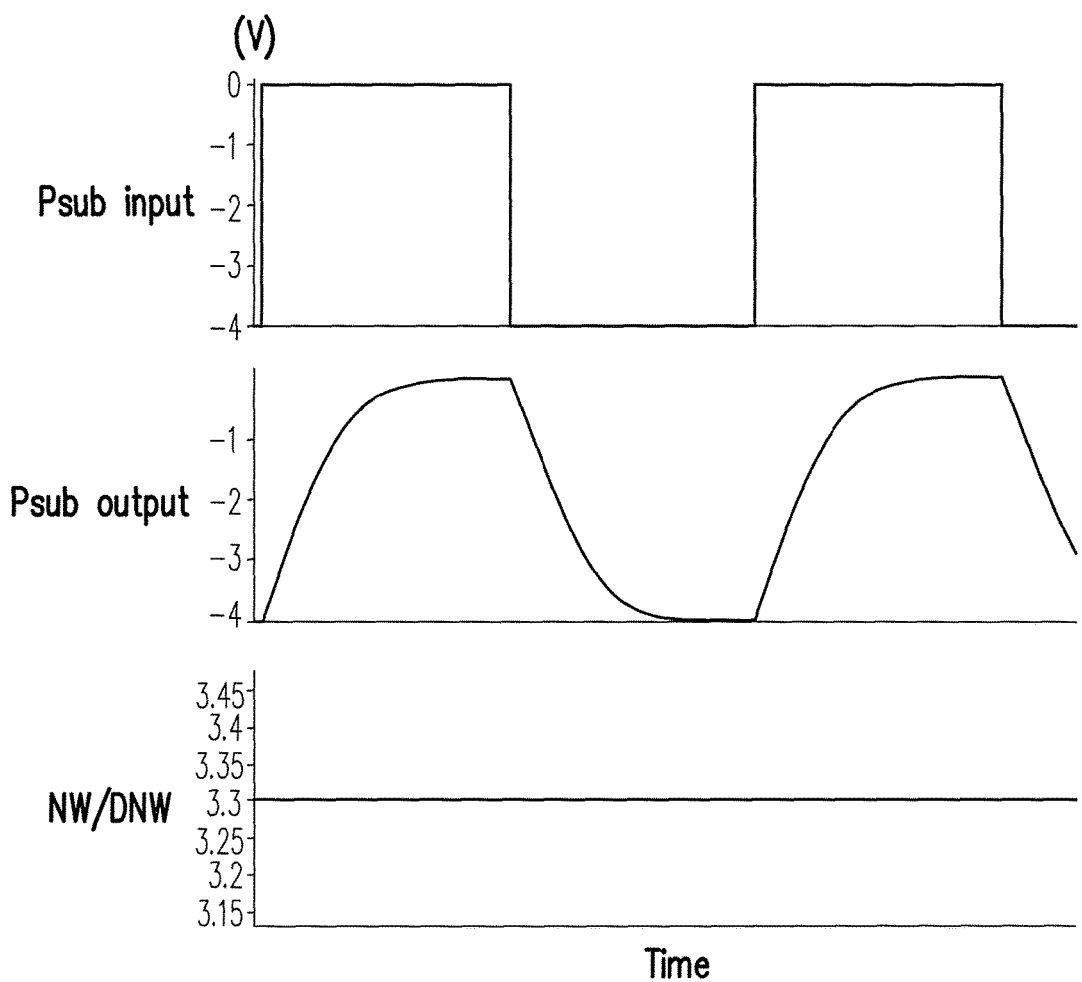
FIG. 2 is a drawing, schematically illustrating operation voltages applied on the semiconductor device in FIG. 1, according to an embodiment of the invention.

FIG. 2 is a drawing, schematically illustrating operation voltages applied on the semiconductor device in FIG. 1, according to an embodiment of the invention. Referring to FIG. 2, in operation as an example, the voltage level of the substrate 100 (Psub input) needs to be frequently switched between a ground voltage and a negative voltage such as −4V while the voltage level of the DNW 102 and the NW 106 (NW/DNW) is kept at a constant positive voltage, such as 3.3V. In this situation, the actual output voltage of the substrate 100 (Psub output) takes a long time to charge up and discharge down to the stable voltage stage. This would at least reduce the operation speed.

Figure 3:
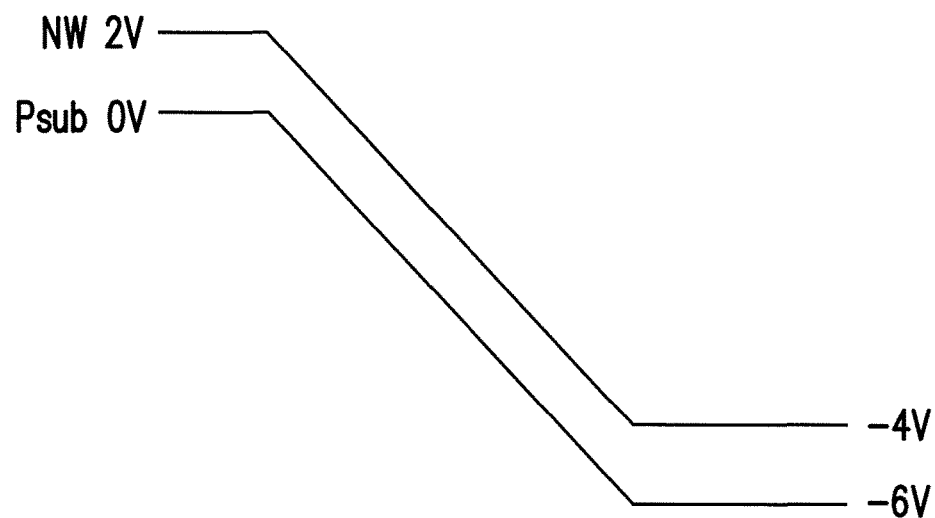
FIG. 3 a drawing, schematically illustrating a voltage level on the N-well in relating with the voltage at the P-type substrate, according to an embodiment of the invention.

The invention has further investigated into the operation mechanism in FIG. 2, and proposed another operation mechanism. FIG. 3 a drawing, schematically illustrating a voltage level on the N-well in relating with the voltage at the P-type substrate, according to an embodiment of the invention. Referring to FIG. 3 with FIG. 1, when a voltage offset between the substrate 100 and the NW 106 is set to a constant, the circuit can still work. For example, the substrate 100 is at the ground voltage (0V) and the NW 106 is at the voltage of 2V, in which the voltage offset is 2V. When the substrate (Psub) 100 is switched from 0V to −6V in an example, the NW 106 can also be switched from 2V to −4V, in which the voltage offset is kept.

It can be noted that the voltages of Psub and NW/DNW are just the examples and the invention is not limited to the specific voltages in operation.

Figure 4:
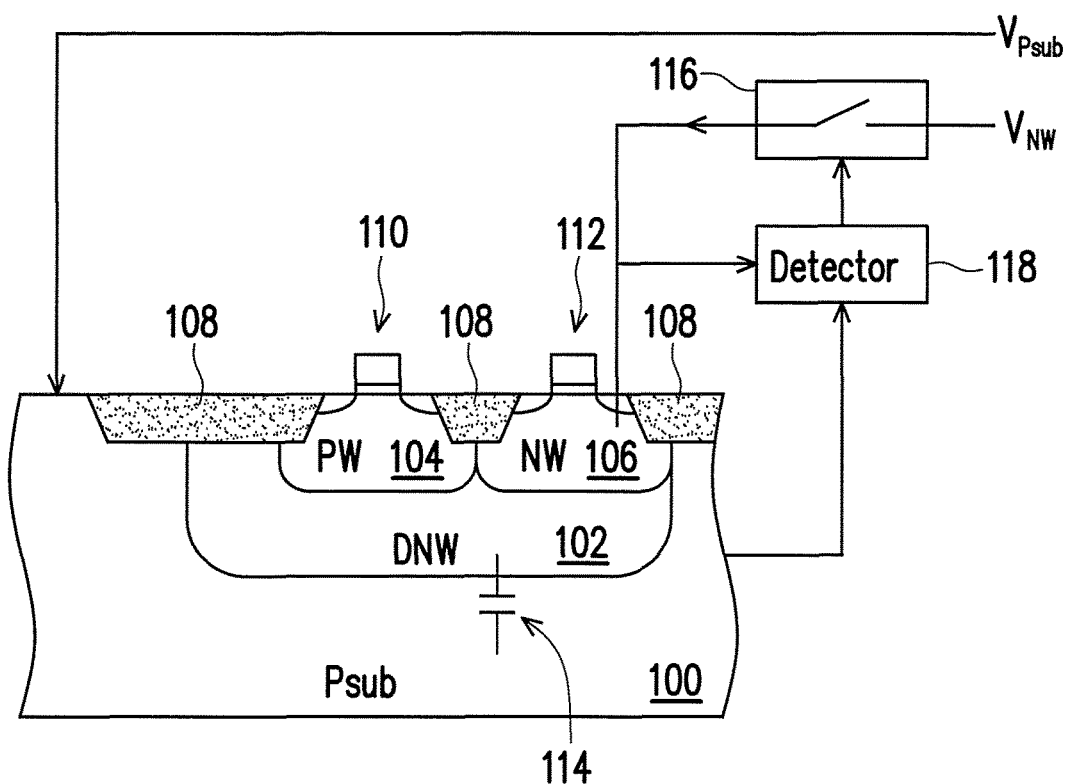
FIG. 4 is a drawing, schematically a cross-sectional view of a semiconductor device with the voltage control mechanism, according to an embodiment of the invention, according to an embodiment of the invention.

FIG. 4 is a drawing, schematically a cross-sectional view of a semiconductor device with the voltage control mechanism, according to an embodiment of the invention, according to an embodiment of the invention. Referring to FIG. 4, base on the feature in FIG. 3, the voltage control mechanism is further proposed, in which the effect of a parasitic capacitor 114 between the DNW 102 in N-type and the substrate 100 in P-type is taken into account.

In operation, the substrate 100 is to be applied by a substrate voltage ($V_{Psub}$) while a well power for applying a well voltage ($V_{NW}$) to the doped well, such as NW 106, is turned off or disconnected by the switch 116. The voltages at the NW 106 and the DNW 102 with the same conductive type are same. In other words, the NW 106 is at the floating state without applying with the well voltage ($V_{NW}$). Then, due to the effect of the parasitic capacitor 114, the voltage level of the NW 106 in floating state is changing with the change of the substrate voltage ($V_{Psub}$), in which the voltage offset is basically maintained.

Then, a voltage level of the NW 106 is detected by the detector 118. Remarkably, since the voltage level of the NW 106 is changing with the change of the substrate voltage ($V_{Psub}$), a voltage level of the substrate 100 can also be detected by the detector 118 as an option instead. The voltage detection is to judge whether or not a voltage target is reached. The voltage target in an example is set in a range of 50% to 90% of a full voltage level to be applied to the one of the well voltage ($V_{NW}$) and the substrate voltage ($V_{Psub}$) as chosen.

The detector 118 accordingly outputs a control signal to the switch 116 to switch to the conducting state. In other words, when the voltage level as detected reaches to the voltage target, the well power is turned on to apply the well voltage ($V_{NW}$) to the doped well, such as NW 106, through the switch 116.

Figure 5:
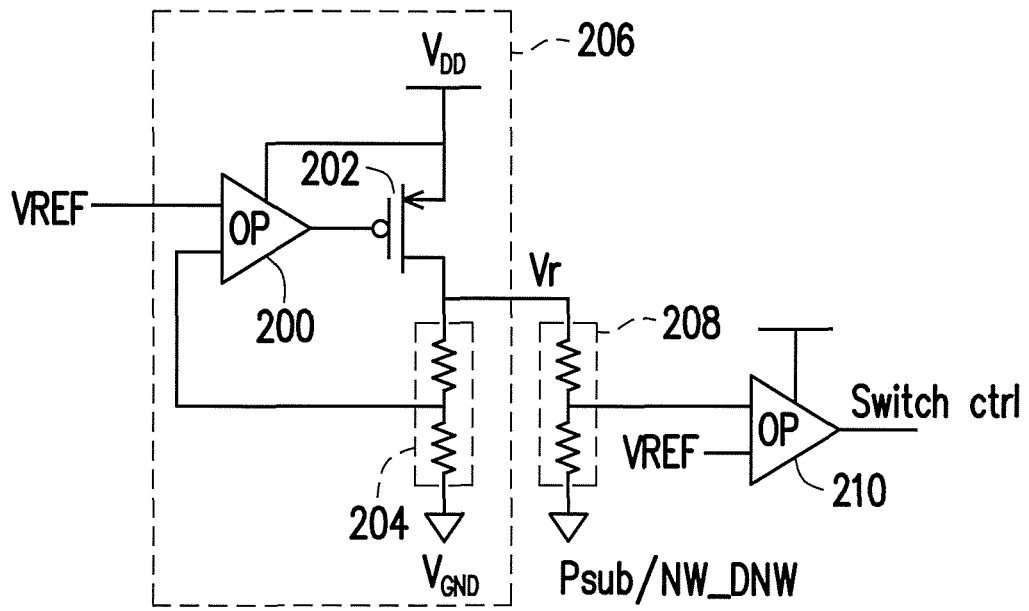
FIG. 5 is a drawing, schematically illustrating a circuit of detector used in FIG. 4, according to an embodiment of the invention.

FIG. 5 is a drawing, schematically illustrating a circuit of detector used in FIG. 4, according to an embodiment of the invention. Referring to FIG. 5, the circuit in an example for the detector 118 can include a regulating circuit 206 to provide a regulated voltage Vr, which is less than the system voltage $V_{DD}$. The regulating circuit 206 in an example can include an operational amplifier (OP) 200, a transistor 202, and a resistor string 204, so that the regulated voltage Vr can be obtained by dividing from the resistor string 204. The regulated voltage Vr is at the proper range to connect to the substrate (Psub) 100 or the NW/DWN 106/102, as the chosen, through the resistor string 208. A dividing voltage from the resistor string 208 is output to the operation amplifier (OP) 210. The VREF for the OP 210 is corresponding to the voltage target. As noted, the dividing voltage from the resistor string 208 is changing with the voltage of the substrate (Psub) 100 or the NW/DWN 106/102, in which the NW/DWN 106/102 is at the floating state because the switch 116 is at the disconnecting state. Remarkably, the invention is not limited to the specific circuit of detector.

Also still referring to FIG. 4, when the detected voltage of the substrate (Psub) 100 or the NW/DWN 106/102 reaches to a voltage target, the switch control signal (Switch ctrl) applied to the switch 116 can turn on the switch 118 to be the conductive state. As a result, the well voltage ($V_{NW}$) can be applied to the NW/DNW 106/102 through the switch 116.

Figure 6:
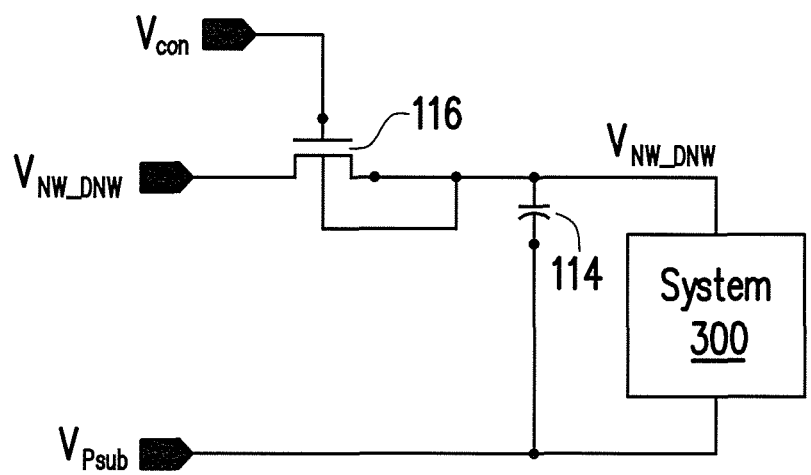
FIG. 6 is a drawing, schematically illustrating a circuit to perform the method for controlling the voltages on doped well in a substrate, according to an embodiment of the invention.

FIG. 6 is a drawing, schematically illustrating a circuit to perform the method for controlling the voltages on doped well in a substrate, according to an embodiment of the invention. Referring to FIG. 6, a control circuit is shown in alternative way. The system 300 represents an integrated circuit of the system 300, in which the substrate is to applied with a substrate voltage ($V_{Psub}$), which is frequently switched between two voltage levels. The well voltage, such as $V_{NW\_DNW}$, is to be applied to the doped well with a voltage offset from the substrate voltage ($V_{Psub}$). A parasitic capacitor 114 is formed between the substrate 100 and the DNW 102 as shown in FIG. 4. By monitoring the voltage level at the NW/DNW 106/102 in an example, the switch 116 such as a transistor switch is controlled by the control voltage (Vcon) to turn on. As a result, the voltage $V_{NW\_DNW}$ can be applied to the system 300 when the detected voltage level at the NW/DNW 106/102 reaches to a voltage target.

Alternatively in an embodiment, an apparatus for controlling voltage of a doped well in a substrate is provided. The substrate 100 and the doped well, such as the DNW 102 with the NW 106 are in different conductive type. The apparatus includes a substrate power with capability to provide a substrate voltage ($V_{Psub}$). Further, a well power has capability to provide a well voltage ($V_{NW}$). When the substrate power starts to apply the substrate voltage ($V_{Psub}$) to the substrate 100, the well power stops applying the well voltage ($V_{NW}$) to the doped well 102/106. A detector 118 is to detect a voltage level of one of the doped well 102/106 and the substrate 100 to judge whether or not a voltage target is reached. When the voltage target is reached, the well power under control starts to apply the well voltage ($V_{NW}$) to the doped well 102/106.

Figure 7:
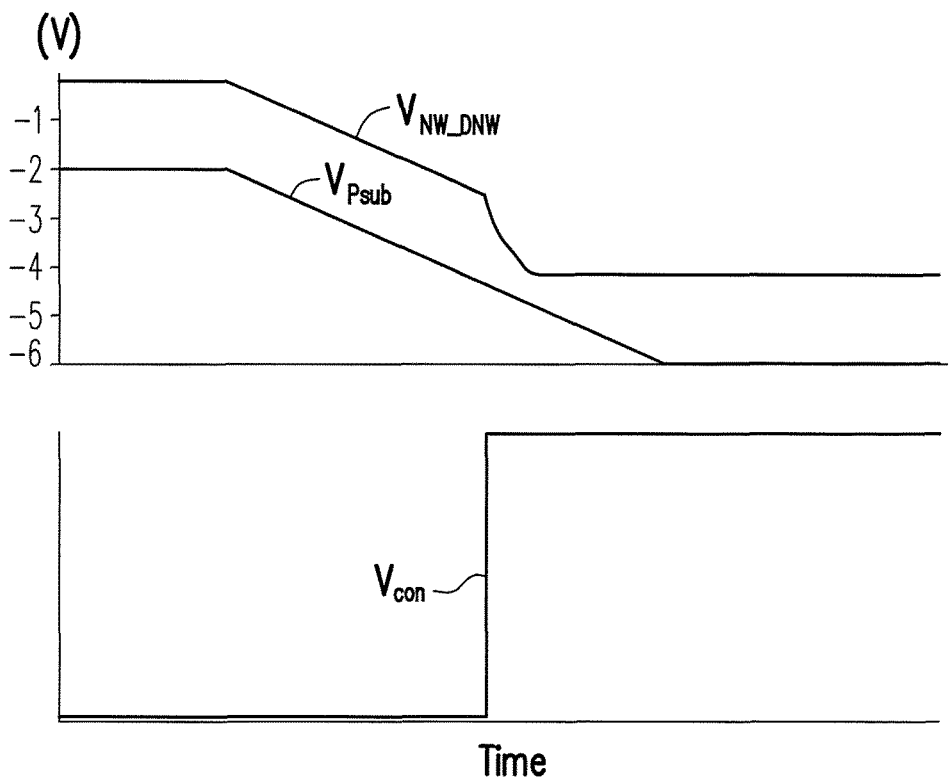
FIG. 7 is a drawing, schematically illustrating the control effect by the method for controlling the voltages, according to an embodiment of the invention.

FIG. 7 is a drawing, schematically illustrating the control effect by the method for controlling the voltages, according to an embodiment of the invention. Referring to FIG. 7 with FIGS. 4-6 as an example, the substrate voltage ($V_{Psub}$) is to be switched from −2V to −6V and the well voltage ($V_{NW\_DNW}$) is be switched from 0V to −4V with the voltage offset of 2V from the substrate voltage ($V_{Psub}$). The switch control signal (Switch ctrl) shown in FIG. 5 represented by the control voltage (Vcon) has the wave form between two control states. In the beginning stage, the switch control signal (Switch ctrl) turns off the switch 116 and the NW 106 stays at the floating state. Due to the coupling effect by the parasitic capacitor 114, the voltage level of the well voltage ($V_{NW\_DNW}$) at the NW 106 is accordingly dropping with the substrate voltage ($V_{Psub}$), in which the voltage offset of 2V as an example is basically maintained. When the detected voltage at the NW 106 indicates that the voltage target is reached, the control voltage (Vcon) changes to the second state to turn on the switch 116 for conducting state. The voltage target is close to the full voltage level, such as −4V, for the well voltage. In an example, the voltage target can be set in a range of 50% to 90% of the full voltage level for the well voltage. However in alternative way, if the substrate voltage ($V_{Psub}$) is detected, then the voltage target compared with the full voltage level, such as −6V, for the substrate voltage. Likewise, the voltage target can be set in a range of 50% to 90% of the full voltage level for the substrate voltage. When the detected voltage reaches to the voltage target, the switch 116 is turned on, and then the well voltage as preset is applied to the NW/DNW 106/102 through the switch 116. It then takes shorter time for discharging and reaches to stable voltage state.

Figure 8:
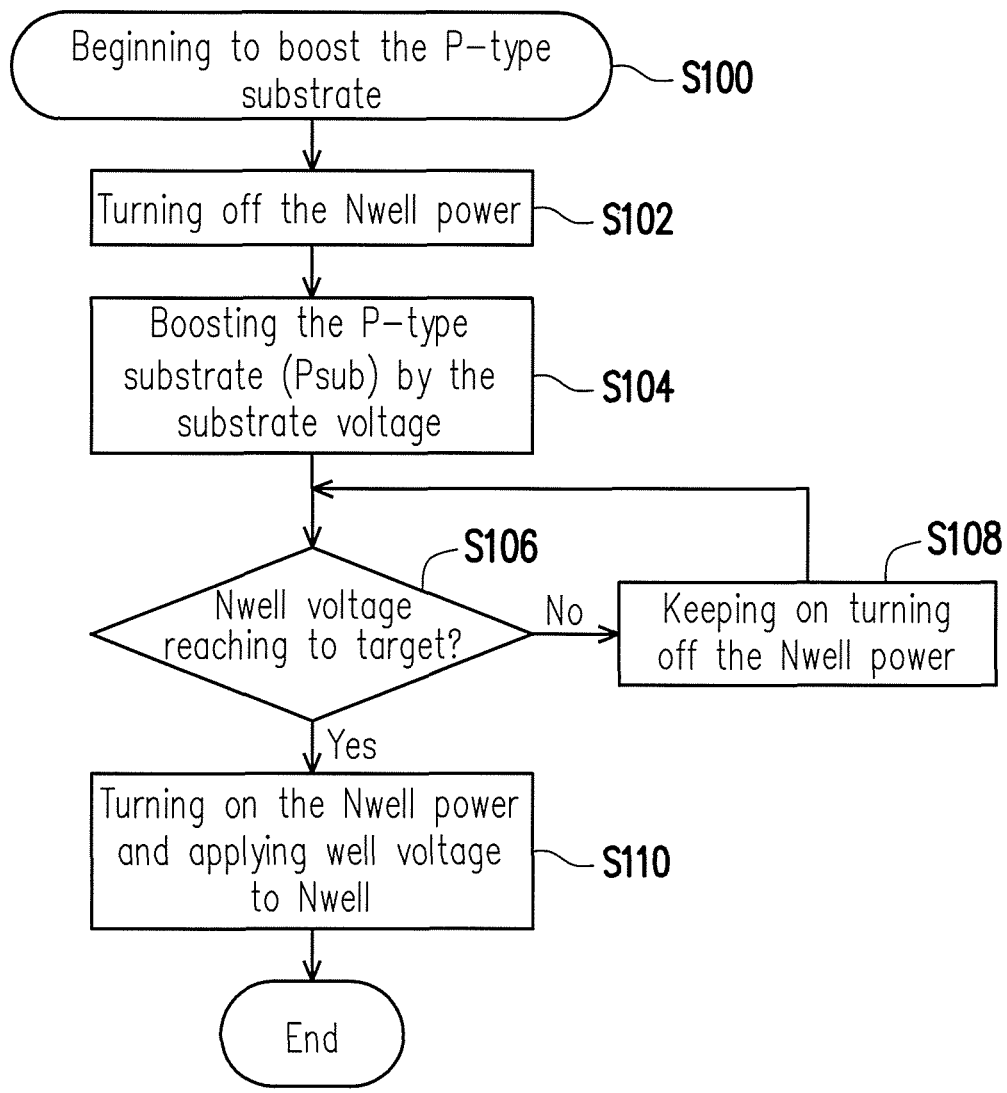
FIG. 8 is a drawing, schematically illustrating the flow diagram of a method to apply voltage to the N-well, according to an embodiment of the invention.

FIG. 8 is a drawing, schematically illustrating the flow diagram of a method to apply voltage to the N-well, according to an embodiment of the invention. Referring to FIG. 8, taking an example to switch the substrate voltage from ground voltage to a negative voltage, in step S100, it begins to boost the P-type substrate (Psub) by a negative voltage as preset. In step S102, the power for applying to the N-type doped well (Nwell) is switched off. In step 104, it boosts the P-type substrate (Psub) by the substrate voltage. In step S106, the voltage level at the Nwell is detected and judged whether or not reaches to the voltage target (threshold). In step S108, if the detected voltage at the N-well in step S106 is not reached yet, it keeps on turning off the power for Nwell. In step S110, if the detected voltage at the N-well in step S106 has been reached, the power for applying to the N-type doped well is turned on for applying the well voltage to the Nwell. Then, this switching procedure goes to an end.

Remarkably, the foregoing embodiments are to switch the substrate voltage from high voltage level to low voltage level, such as from 0V to −6V in an example. However, the similar effect occurs to the situation for switching the substrate voltage form low voltage level to the high voltage level, such as from −6V to 0V in an example.

Figure 9:
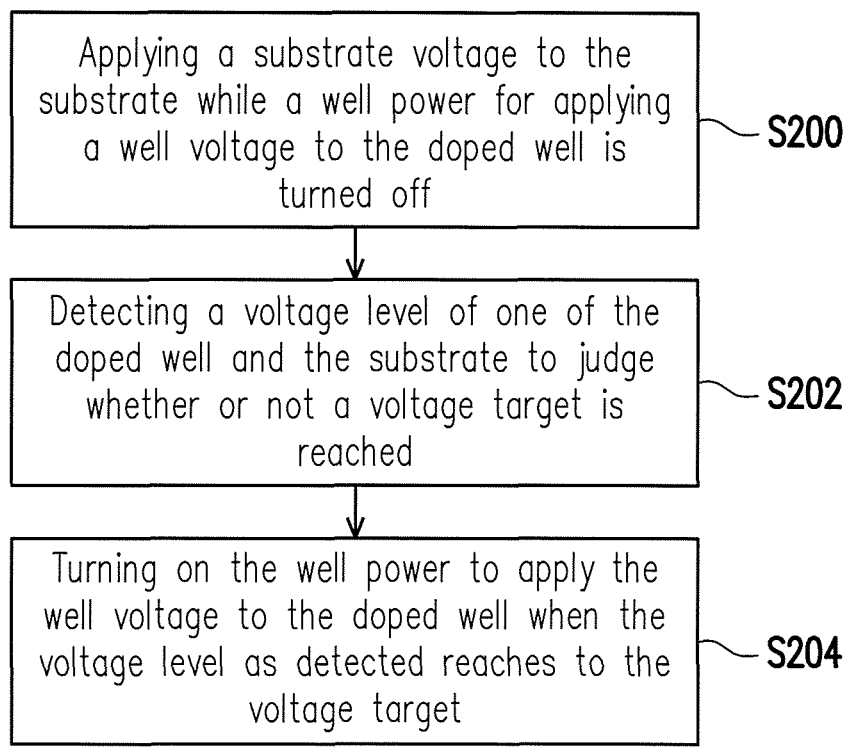
FIG. 9 is a drawing, schematically illustrating a method for controlling voltage of a doped well in a substrate, according to an embodiment of the invention.

FIG. 9 is a drawing, schematically illustrating a method for controlling voltage of a doped well in a substrate, according to an embodiment of the invention. Referring to FIG. 9, a method for controlling voltage of a doped well in a substrate, wherein the substrate and the doped well are in different conductive type. In step S200, it applies a substrate voltage to the substrate while a well power for applying a well voltage to the doped well is turned off. In step S202, it detects a voltage level of one of the doped well and the substrate to judge whether or not a voltage target is reached. In step S204, it turns on the well power to apply the well voltage to the doped well when the voltage level as detected reaches to the voltage target.

In a further embodiment, the substrate voltage is a negative voltage and the substrate is initially at a ground voltage. In a further embodiment, the substrate voltage is a ground voltage and the substrate is initially at a negative voltage. In a further embodiment, the step of detecting the voltage level of the one of the doped well and the substrate is performed by a detector. In a further embodiment, the step of turning on the well power is using a switch. In a further embodiment, the detector is a voltage detector. In a further embodiment, the doped well is N-type well and the substrate is P-type substrate, or the doped well is P-type well and the substrate is N-type substrate. In a further embodiment, the well voltage is different from the substrate voltage by a voltage offset. In a further embodiment, a parasitic capacitor is Ruined between the doped well and the substrate. In a further embodiment, the voltage target is set in a range of 50% to 90% of a full voltage level for the one of the well voltage and the substrate voltage.

Figure 10:
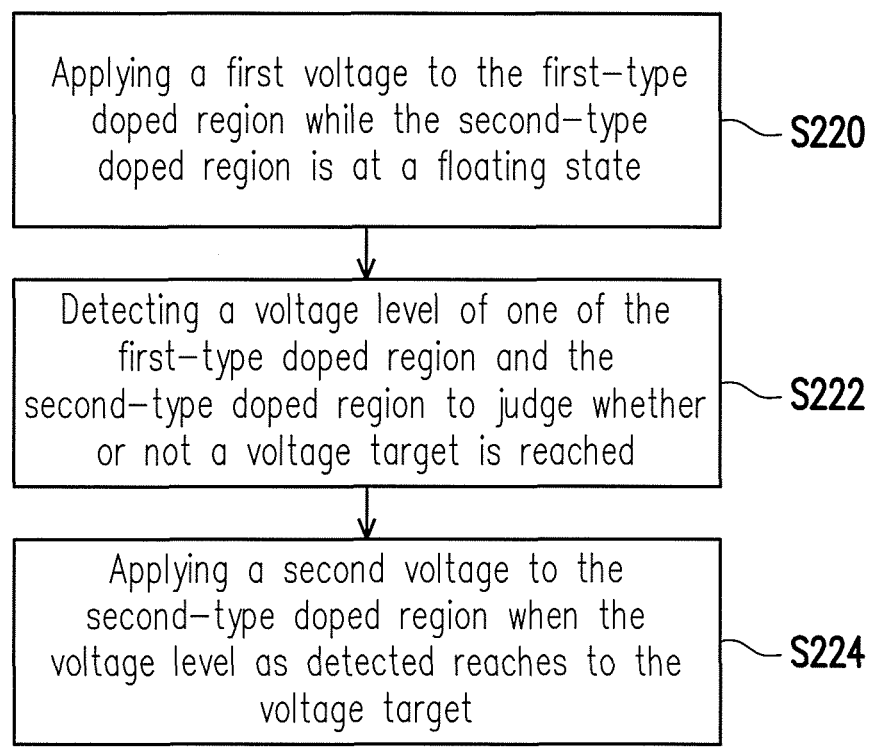
FIG. 10 is a drawing, schematically illustrating a method for controlling voltages on a first-type doped region and a second-type doped region in a substrate, according to an embodiment of the invention.

Further in alternative way, FIG. 10 is a drawing, schematically illustrating a method for controlling voltages on a first-type doped region and a second-type doped region in a substrate, according to an embodiment of the invention. Referring to FIG. 10, a method for controlling voltages on a first-type doped region and a second-type doped region in a substrate is also provided. In step S220, it applies a first voltage to the first-type doped region while the second-type doped region is at a floating state. In step 222, it detects a voltage level of one of the first-type doped region and the second-type doped region to judge whether or not a voltage target is reached. In step S224, it applies a second voltage to the second-type doped region when the voltage level as detected reaches to the voltage target.

In a further embodiment, the first voltage is a negative voltage and the first-type doped region is initially at a ground voltage. In a further embodiment, the first voltage is a ground voltage and the first-type doped region is initially at a negative voltage. In a further embodiment, the step of detecting the voltage level of the one of the first-type doped region and the second-type doped region is performed by a detector. In a further embodiment, the step of applying the second voltage to the second-type doped region is using a switch and the switch is controlled by the detector. In a further embodiment, the detector is a voltage detector. In a further embodiment, the second-type doped region is N-type well and the first-type doped region is P-type, or the second-type doped region is P-type well and the first-type doped region is N-type. In a further embodiment, the first voltage is different from the second voltage by a voltage offset. In a further embodiment, the first-type doped region and the second-type doped region are in different conductive types and form a parasitic capacitor at an interface. In a further embodiment, the voltage target is set in a range of 50% to 90% of a full voltage level for the one of the first-type doped region and the second-type doped region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for controlling voltage of a doped well in a substrate, the method comprising:
applying a substrate voltage to the substrate of a semiconductor device while a well power for applying a well voltage to the doped well is turned off, wherein the semiconductor device comprises:
the substrate of a first conductive type;
the doped well of a second conductive type disposed in the substrate, wherein the first conductive type is different from the second conductive type; and
a transistor-substrate doped well of the second conductive type disposed in the doped well, wherein the doped well and the transistor-substrate doped well are at same voltage level; and
a transistor of the first conductive type, disposed on the transistor-substrate doped well;
detecting a voltage level of one of the doped well and the substrate to judge whether or not a voltage target is reached; and
turning on the well power to apply the well voltage to the doped well when the voltage level as detected reaches to the voltage target.

2. The method as recited in claim 1, wherein the substrate voltage is a negative voltage and the substrate is initially at a ground voltage.

3. The method of claim 1, wherein the substrate voltage is a ground voltage and the substrate is initially at a negative voltage.

4. The method of claim 1, wherein the step of detecting the voltage level of the one of the doped well and the substrate is performed by a detector.

5. The method of claim 4, wherein the step of turning on the well power is using a switch.

6. The method of claim 4, wherein the detector is a voltage detector.

7. The method of claim 1, wherein the doped well is N-type well and the substrate is P-type substrate, or the doped well is P-type well and the substrate is N-type substrate.

8. The method of claim 1, wherein the well voltage is different from the substrate voltage by a voltage offset.

9. The method of claim 1, wherein a parasitic capacitor is formed between the doped well and the substrate.

10. The method of claim 1, wherein the voltage target is set in a range of 50% to 90% of a full voltage level for the one of the well voltage and the substrate voltage.

11. An apparatus for controlling voltage of a doped well in a substrate, the apparatus comprising:
a substrate power, with capability to provide a substrate voltage to the substrate of a semiconductor device, wherein the semiconductor device comprises:
the substrate of a first conductive type;
the doped well of a second conductive type disposed in the substrate, wherein the first conductive type is different from the second conductive type; and
a transistor-substrate doped well of the second conductive type disposed in the doped well, wherein the doped well and the transistor-substrate doped well are at same voltage level; and
a transistor of the first conductive type, disposed on the transistor-substrate doped well;
a well power, with capability to provide a well voltage, wherein when the substrate power starts to apply the substrate voltage to the substrate, the well power stops applying the well voltage to the doped well; and
a detector, to detect a voltage level of one of the doped well and the substrate to judge whether or not a voltage target is reached, wherein when the voltage target is reached, the well power under control starts to apply the well voltage to the doped well.

12. The apparatus of claim 11, wherein the substrate voltage is a negative voltage and the substrate is initially at a ground voltage.

13. The apparatus of claim 11, wherein the substrate voltage is a ground voltage and the substrate is initially at a negative voltage.

14. The apparatus of claim 11, wherein the detector comprises:
a regulating circuit, to provide a regulated voltage at an output node, which is less than a system voltage;
a resistor string, coupled between the output node of the regulating circuit and one of the doped well and the substrate; and
an operational amplifier, to receive a dividing voltage from the resistor string to compare with a reference voltage and to judge whether or not the voltage target is reached.

15. The apparatus of claim 14, further comprising a switch, wherein the switch is controlled by the detector to cause the well power starts to apply the well voltage to the doped well.

16. The apparatus of claim 14, wherein the detector is a voltage detector.

17. The apparatus of claim 11, wherein the doped well is N-type well and the substrate is P-type substrate, or the doped well is P-type well and the substrate is N-type substrate.

18. The apparatus of claim 11, wherein the well voltage is different from the substrate voltage by a voltage offset.

19. The apparatus of claim 11, wherein a parasitic capacitor is formed between the doped well and the substrate.

20. The apparatus of claim 11, wherein the voltage target is set in a range of 50% to 90% of a full voltage level for the one of the well voltage and the substrate voltage.

* * * * *